United States Patent
Kudo et al.

[11] Patent Number: 5,303,255
[45] Date of Patent: Apr. 12, 1994

[54] DISTRIBUTED FEEDBACK SEMICONDUCTOR LASER DEVICE AND A METHOD OF PRODUCING THE SAME

[75] Inventors: Hiroaki Kudo; Haruhisa Takiguchi; Kazuhiko Inoguchi; Chitose Nakanishi; Satoshi Sugahara, all of Nara, Japan

[73] Assignee: Sharp Kabushiki Kaisha, Osaka, Japan

[21] Appl. No.: 85,129

[22] Filed: Jun. 29, 1993

Related U.S. Application Data

[63] Continuation of Ser. No. 979,474, Nov. 20, 1992, abandoned, which is a continuation of Ser. No. 756,852, Sep. 10, 1991, abandoned.

[30] Foreign Application Priority Data

Sep. 10, 1990 [JP] Japan ............... 2-240770
Aug. 9, 1991 [JP] Japan ............... 3-200844

[51] Int. Cl.$^5$ ............... H01S 3/08; H01S 3/19
[52] U.S. Cl. ............... 372/96; 372/45; 372/46
[58] Field of Search ............... 372/96, 45, 46

[56] References Cited

U.S. PATENT DOCUMENTS

| | | | |
|---|---|---|---|
| 4,745,615 | 5/1988 | Kaneiwa et al. | 372/96 |
| 4,847,844 | 7/1989 | Nodo et al. | 372/46 |
| 4,872,174 | 10/1989 | Matsui et al. | 372/96 |
| 4,888,783 | 12/1989 | Kojima et al. | 372/96 |
| 4,984,243 | 1/1991 | Kagawa et al. | 372/46 |
| 5,084,894 | 1/1992 | Yamamoto | 372/96 |

FOREIGN PATENT DOCUMENTS

| | | |
|---|---|---|
| 0385388 | 9/1990 | European Pat. Off. |
| 60-145685 | 8/1985 | Japan |
| 1-274488 | 11/1989 | Japan |
| 1-304793 | 12/1989 | Japan |
| 2-202085 | 8/1990 | Japan |
| 2-206191 | 8/1990 | Japan |

OTHER PUBLICATIONS

*Patent Abstract of Japan*, vol. 9, No. 201, (E-336) Aug. 17 1985.
*Patent Abstracts of Japan*, vol. 12, No. 304, (E-646) Aug. 18, 1988.
Macomber et al., *Applied Physics Letters* (1987) 51(7):472-474.
W. T. Tsang et al., Appl. Phys. Lett., 34(11), Jun. 1, 1979 pp. 752-755.
J. J. Coleman and P. D. Dapkus, Appl. Phys. Lett. 37(3), Aug. 1, 1980 pp. 262-263.

*Primary Examiner*—Georgia Y. Epps
*Attorney, Agent, or Firm*—Morrison & Foerster

[57] ABSTRACT

A distributed feedback semiconductor laser device comprising a current blocking structure having a stripe groove, and a diffraction grating formed in the bottom of the stripe groove. The current blocking structure is formed over an active layer for laser oscillation, and it includes an etch stop layer against a groove etching in a lower potion of the current blocking structure. The refractive index distribution in transverse directions inside the stripe groove is controlled by the thickness of the optical guiding layer, enabling oscillation of the fundamental transverse mode.

13 Claims, 10 Drawing Sheets

DISTRIBUTED FEEDBACK SEMICONDUCTOR LASER DEVICE AND A METHOD OF PRODUCING THE SAME

This application is a continuation of application Ser. No. 07/979,474, filed Nov. 20, 1992, which is a continuation of application Ser. No. 07/756,852, filed Sep. 10, 1991 and now abandoned.

BACKGROUND OF THE INVENTION

1. Field of the Invention

This invention relates to a distributed feedback semiconductor laser device and a method of producing the same.

2. Description of the Prior Art

Generally, the gain of a semiconductor laser device spans a relatively broad spectral range, and even when transverse modes are controlled, a perfectly single longitudinal mode can hardly be achieved. In DC operation, it may appear that a single longitudinal mode is achieved, but in practice, the oscillation is in multi longitudinal modes because of temperature variations and other factors.

A DFB (distributed feedback) semiconductor laser device is constructed with a resonator having a wavelength selectivity. In this type of semiconductor laser device, a diffraction grating is provided adjacent to an active region for laser oscillation, to selectively reflect laser light of a single wavelength within the gain spectral range, thereby attaining laser oscillation in a single longitudinal mode.

As an example of the DFB semiconductor laser devices in which stable oscillation in both single transverse and single longitudinal modes can be obtained, there has previously been proposed a semiconductor laser device as shown in FIG. 10 (refer to Appl. Phys. Lett., 34(11), pp.752–755(1979)). This type of semiconductor laser device is called an SBH-DFB laser device since it has a stripe buried heterostructure (SBH).

As shown in FIG. 10, a stripe-shaped GaAs active layer 23 formed along the resonator direction is flanked at both sides by a p-$Al_{0.36}Ga_{0.64}As$ first buried layer 30 and is sandwiched, together with an underlying n-$Al_{0.15}Ga_{0.85}As$ optical guiding layer 25, between an n-$Al_{0.36}Ga_{0.64}As$ first cladding layer 22 and a p-$Al_{0.36}Ga_{0.64}As$ second cladding layer 26. A diffraction grating 34 that provides a distributed feedback configuration is formed at the interface between the n-$Al_{0.15}Ga_{0.85}As$ optical guiding layer 25 and the p-$Al_{0.36}Ga_{0.64}As$ first buried layer 30.

In the above semiconductor laser device, laser light generated in the GaAs active layer 23 seeps into the underlying n-$Al_{0.15}Ga_{0.85}As$ optical guiding layer 25 through which the laser light is guided. Since the n-$Al_{0.15}Ga_{0.85}As$ optical guiding layer 25 has a greater refractive index than that of the GaAs active layer 23, a smooth refractive index distribution with an effective refractive index increasing at portions underlying the GaAs active layer 23 is formed in lateral directions perpendicular to the resonator direction. As a result, even in high output power operations, stable oscillation of a fundamental transverse mode can be obtained.

Also, the laser light that seeped into the n-$Al_{0.15}Ga_{0.85}As$ optical guiding layer 25 interacts with the refractive index distribution formed by the diffraction grating 34 along the resonator direction, to selectively reflect laser light of the Bragg wavelength that is determined by the pitch of the diffraction grating 34. Therefore, even when the driving current increases up to a value about three times the threshold current required to initiate oscillation, the wavelength of the oscillation does not vary and stable oscillation in a single longitudinal mode can be obtained.

However, because of its complex fabrication process sequence, the above prior art SBH-DFB laser device has had the problems of a low product yield and poor reproducibility of device characteristics. The SBH-DFB laser device shown in FIG. 10 is fabricated in the following steps, for example.

First, using an epitaxial growth technique, an n-$Al_{0.36}Ga_{0.64}As$ first cladding layer 22, an n-$Al_{0.15}Ga_{0.85}As$ optical guiding layer 25, a GaAs active layer 23, a p-$Al_{0.36}Ga_{0.64}As$ second cladding layer 26, and a p-GaAs contact layer 27 are sequentially grown on an n-GaAs substrate 21.

Next, using a selective etching technique, the GaAs active layer 23, the p-$Al_{0.36}Ga_{0.64}As$ second cladding layer 26, and the p-GaAs contact layer 27 are etched in a stripe pattern to form a mesa structure. Then, by a chemical etching using a photoresist mask, a diffraction grating 34 is formed over the surface of the n-$Al_{0.15}Ga_{0.85}As$ optical guiding layer 25 exposed on both sides of the mesa structure.

Thereafter, using a liquid-phase epitaxial growth technique, a p-$Al_{0.36}Ga_{0.64}As$ first buried layer 30 and an n-$Al_{0.36}Ga_{0.64}As$ second buried layer 31 are grown one on top of the other on both sides of the mesa structure, to cover the surface of the n-$Al_{0.15}Ga_{0.85}As$ optical guiding layer 25 as well as to bury the mesa structure.

Finally, a dielectric layer 37 for restricting the current injection region is deposited on a prescribed region of n-$Al_{0.36}Ga_{0.64}As$ second buried layer 31, and after forming an n-side electrode 32 on the underside of the n-GaAs substrate 21 and a p-side electrode 33 on the upper surface of the dielectric layer 37 and the current injection region, the wafer is cleaved to form the endfaces of the resonator, thus completing the fabrication of the SBH-DFB laser device shown in FIG. 10.

As described, in the above SBH-DFB laser device, the laser light that seeped into the n-$Al_{0.15}Ga_{0.85}As$ optical guiding layer 25 is selectively reflected by the diffraction grating 34 formed at the interface between the n-$Al_{0.15}Ga_{0.85}As$ optical guiding layer 25 and the p-$Al_{0.35}Ga_{0.64}As$ first buried layer 30, in order to accomplish the optical feedback. The coupling efficiency of the laser light and diffraction grating 34 is dependent on the proportion of the laser light that seeped into the n-$Al_{0.15}Ga_{0.85}As$ optical guiding layer 25 to the total amount of laser light generated in the GaAs active layer 23.

Therefore, when the refractive index difference in lateral directions perpendicular to the resonator direction is increased in order to enhance the oscillation characteristics of single transverse modes, the seeping amount of the laser light decreases, resulting in a decrease in the coupling efficiency and thus degrading the oscillation characteristics of single longitudinal modes. Conversely, when the seeping amount of the laser light is increased in order to enhance the oscillation characteristics of single longitudinal modes, oscillation stability of the fundamental transverse mode deteriorates.

To overcome such a problem, an SBH-DFB laser device as shown in FIG. 11 has been proposed. This laser device is essentially the same as the SBH-DFB laser device shown in FIG. 10, except that the diffraction grating 34 is also formed at the interface between the GaAs active layer 23 and the underlying n-$Al_{0.15}Ga_{0.85}As$ optical guiding layer 25.

However, in the above configuration, after the n-$Al_{0.36}Ga_{0.64}As$ first cladding layer 22 and the n-$Al_{0.15}Ga_{0.85}As$ optical guiding layer 25 have been sequentially grown on the n-GaAs substrate 21, the growth step must be stopped temporarily in order to form the diffraction grating 34 on the surface of the n-$Al_{0.15}Ga_{0.85}As$ optical guiding layer 25, requiring a total of three growth steps to add to the complexity of the fabrication process. Also, since the GaAs active layer 23 is grown on top of the diffraction grating 34, there is a possibility that detrimental effects may be caused to the device characteristics, such as a degradation in its crystallinity and an increase in the oscillation threshold current.

To overcome the above problems, there have been proposed DFB semiconductor laser devices that can be fabricated with only two crystal growth steps (such as disclosed in Japanese Laid-Open Patent Publication Nos. 60-145685 and 2-206191). FIG. 12 shows one of the DFB semiconductor laser devices fabricated from AlGaAs/GaAs materials. The DFB semiconductor laser device shown in FIG. 12 is fabricated with two crystal growth steps using, for example, a metal-organic chemical vapor deposition (MOCVD) method. The optical waveguide necessary for laser oscillation and the diffraction grating essential to the DFB configuration are formed during these two crystal growth steps. The fabrication method is described in detail below.

First, using an MOCVD technique, an n-GaAs buffer layer 301, an n-$Al_{0.5}Ga_{0.5}As$ first cladding layer 302, a non-doped $Al_{0.13}Ga_{0.87}As$ active layer 303, a p-$Al_{0.5}Ga_{0.5}As$ carrier barrier layer 304, a p-$Al_{0.25}Ga_{0.75}As$ optical guiding layer 307, and an n-GaAs current blocking layer 305 are sequentially grown on an n-GaAs substrate 300, as shown in FIG. 12.

Next, using photolithography and chemical etching techniques, a portion of the n-GaAs current blocking layer 305 is selectively etched to form a stripe groove (about 4 μm in width) extending in parallel to the resonator direction, thereby exposing the surface of the p-$Al_{0.25}Ga_{0.75}As$ optical guiding layer 307 in the bottom of the stripe groove. As an etchant, a mixed solution of $NH_4OH$, $H_2O_2$, and $H_2O$ is used. In this chemical etching step, by appropriately adjusting the mixing ratio of $NH_4OH$ and $H_2O_2$, a difference can be created in etch rate between the n-GaAs current blocking layer 305 and the p-$Al_{0.25}Ga_{0.75}As$ optical guiding layer 307, which makes it easier to selectively etch only the n-GaAs current blocking layer 305.

Then, using the two-beam interference exposure method and a chemical etching technique, a diffraction grating 306 is formed on the surface of the optical guiding layer 307 within the stripe groove. Thereafter, using MOCVD, a p-$Al_{0.75}Ga_{0.25}As$ second cladding layer 308 and a p-GaAs contact layer 309 are grown on top of the current blocking layer 305 and the optical guiding layer 307. Finally, after forming a p-side electrode 310 on top of the contact layer 309 and an n-side electrode 320 on the underside of the substrate 300, the wafer is cleaved into chips providing the desired resonator length, thus completing the fabrication of the DFB semiconductor laser device shown in FIG. 12.

In the above configured semiconductor laser device, since the current blocking layer 305 is formed adjacent to the active layer 303 and outside the stripe groove extending along the resonator direction, the current blocking layer 305 functions as a light absorbing layer. As a result, a difference is created in refractive index between the inside and the outside of the stripe groove, thus providing optical confinement in horizontal directions. Laser light generated in the active layer 303 seeps into the overlying optical guiding layer 307 through which the laser light is guided. The laser light that seeped into the optical guiding layer 307 interacts with the refractive index distribution formed by the diffraction grating 306 along the resonator direction, to selectively reflect laser light of the Bragg wavelength that is determined by the pitch of the diffraction grating 306. Therefore, stable oscillation of a single longitudinal mode can be obtained. Furthermore, since the current blocking layer 305 is formed on both sides of the stripe groove that provides the current confining structure, current leakage is reduced and a reduction in the threshold current is expected.

However, the DFB semiconductor laser device involves the following disadvantages.

First, by appropriately adjusting the mixing ratio of $NH_4OH$ and $H_2O_2$, a difference can be created in etch rate between the n-GaAs current blocking layer 305 and the p-$Al_{0.25}Ga_{0.75}As$ optical guiding layer 307, therefore, it is possible to a certain extent to selectively etch only the n-GaAs current blocking layer 305. However, when the Al mole fraction (mixing ratio) x in the $Al_xGa_{1-x}As$ crystals is small, the difference in etch rate between the $Al_xGa_{1-x}As$ crystals and the GaAs crystals is usually not very large. Therefore, the etching endpoint in the n-GaAs current blocking layer 305 is not definite, which prevents good reproducibility of the width of the stripe groove.

Second, it is extremely difficult to apply a resist to a uniform thickness on the inside of the stripe groove in order to form the diffraction grating 306 on the surface of the optical guiding layer 307 that is exposed in the bottom of the stripe groove flanked by the thick current blocking layer 305. In reality, the photoresist remains thick on the inside of the stripe groove near the side walls of the current blocking layer 305. Also, the photoresist remaining on these portions is difficult to expose because of the interference by the side walls of the current blocking layer 305. As a result, when a conventional positive resist is used for patterning the diffraction grating 306, the formation of the diffraction grating 306 is not achieved on the portions near the side walls of the current blocking layer 305, as shown in FIG. 12.

Also, as shown in (b) of FIG. 9, the thickness of the optical guiding layer 307 becomes greater at the portions near the side walls of the current blocking layer 305 (region B in FIG. 9) where the diffraction grating 306 is not formed than at the center portion of the stripe groove (region A in FIG. 9) where the diffraction grating 306 is formed. As a result, the effective refractive index in transverse directions becomes greater in region B than in region A, so that, as shown in (a) of FIG. 9, the light intensity distribution is unevenly shifted toward region B, where the diffraction grating 306 is not formed, from region A where the diffraction grating 306 is formed. As a result, the above method has a fatal disadvantage that the fundamental transverse mode suffers very large waveguide losses since the current blocking layer 305 capable of absorbing the light of oscillation wavelength is disposed adjacent to region B.

Another problem of the semiconductor laser device of an absorption area (gain guide) structure having a stripe groove is that the far-field pattern is narrower in the lateral direction than in the vertical direction and its ellipticity (i.e., the far-field pattern in the vertical direction divided by the far-field pattern in the lateral direction) is large.

SUMMARY OF THE INVENTION

The distributed feedback semiconductor laser device of this invention, which overcomes the above-discussed and numerous other disadvantages and deficiencies of the prior art, comprises a semiconductor substrate; a multilayer structure formed on said semiconductor substrate, said multilayer structure including an active layer for laser oscillation; an optical guiding layer formed on said multilayer structure; a current blocking structure for confining electric currents within a selected region of said active layer, said current blocking structure being formed over said optical guiding layer and having a stripe groove along the cavity length direction, said stripe-shaped groove defining said selected region and exposing said optical guiding layer, and said current blocking structure including an etch stop layer in the lower portion of said current blocking structure; and a diffraction grating formed in a region of said optical guiding layer, said region being located at the bottom of said stripe groove.

In a preferred embodiment, said current blocking structure includes an epitaxial growth support layer in the upper portion of said current blocking structure.

In a preferred embodiment, said current blocking structure includes grating support and epitaxial layers in the upper portion of said current blocking structure, and said multilayer structure includes an epitaxial growth support layer in the upper portion of said multilayer structure.

In a preferred embodiment, said multilayer structure includes a first cladding layer formed under said active layer, and a carrier barrier layer formed on said active layer.

According to the invention, a method of fabricating a distributed feedback semiconductor laser device is provided, comprising the steps of: forming a multilayer structure on a semiconductor substrate, said multilayer structure including an active layer for laser oscillation; forming an optical guiding layer on said multilayer structure; forming at least one etch stop layer on said optical guiding layer; forming a current blocking layer on said etch stop layer; forming a stripe groove along the cavity length direction in said current blocking layer by selectively etching said current blocking layer, to expose a region of said etch stop layer through said stripe groove; selectively etching said exposed region of said etch stop layer; and forming a diffraction grating in said optical guiding layer.

In the distributed feedback semiconductor laser device of the present invention, since the diffraction grating is formed on the surface of the optical guiding layer formed above the active layer, the refractive index difference in lateral directions perpendicular to the resonator direction can be increased without compromising the coupling efficiency of the laser light generated in the active layer with the diffraction grating. As a result, stable oscillation of both single transverse and single longitudinal modes can be obtained. Also, since the active layer is not formed on the diffraction grating, the device characteristics are enhanced, with no degradation in the crystallinity of the active layer and with a reduced threshold current required to initiate oscillation.

The method of fabricating the semiconductor laser device of the present invention requires only two growth steps, one being a first growth step in which the plurality of semiconductor layers including the active layer, optical guiding layer, and current blocking layer are grown on the semiconductor substrate and the other being a second growth step in which after forming the diffraction grating, the second cladding layer and the contact layer are sequentially grown in such a manner as to bury the stripe groove formed in the current blocking layer. As a result, the fabrication process is simplified, while the yield is increased and the reproducibility of the device characteristics is enhanced.

According to the invention, a distributed feedback semiconductor laser device is provided, comprising: a semiconductor substrate; a multilayer structure formed on said semiconductor substrate, said multilayer structure including an active layer for laser oscillation; an optical guiding layer formed on said multilayer structure; a current blocking structure for confining electric currents within a selected region of said active layer, said current blocking structure being formed over said optical guiding layer and having a stripe groove along the cavity length direction, said stripe groove defining said selected region; and a diffraction grating formed in a region of said optical guiding layer, said region being located at the bottom of said stripe groove and at the widthwise center portion of said stripe groove, said region of said optical guiding layer having a greater thickness than that of regions adjacent to the side walls of said stripe groove.

According to the invention, a distributed feedback semiconductor laser device is provided, comprising: a semiconductor substrate; a multilayer structure formed on said semiconductor substrate, said multilayer structure including an active layer for laser oscillation; a current blocking structure for confining electric currents within a selected region of said active layer, said current blocking structure being formed on said multilayer structure and having a stripe groove along the cavity length direction, said stripe groove defining said selected region; a diffraction grating formed in a region of said multilayer structure, said region being located at the bottom of said stripe groove; and an optical guiding layer formed on said diffraction grating, said optical guiding layer having a greater thickness at the widthwise center portion of said optical guiding layer than at portions adjacent to the side walls of said stripe shaped groove.

According to the invention, a method of fabricating a distributed feedback semiconductor laser device is provided, comprising the steps of: forming a multilayer structure on a semiconductor substrate, said multilayer structure including an active layer for laser oscillation; forming a current blocking structure on said multilayer structure; forming a stripe groove along the cavity length direction in said current blocking structure, to expose a surface region of said multilayer structure through said stripe groove; forming a diffraction grating in said surface region of said multilayer structure by a photolithography technique using a positive resist; and forming an optical guiding layer on said surface of said multilayer structure to cover said diffraction grating.

According to the invention, a method of fabricating a distributed feedback semiconductor laser device is provided, comprising the steps of: forming a multilayer structure on a semiconductor substrate, said multilayer structure including an active layer for laser oscillation; forming an optical guiding layer on said multilayer structure; forming a current blocking structure on said multilayer structure; forming a stripe groove along the cavity length direction in said current blocking layer, to expose a surface region of said optical guiding layer through said stripe groove; and forming a diffraction grating in said surface region of said optical guiding layer by a photolithography technique using a negative resist.

In the distributed feedback semiconductor laser device of the present invention, the optical guiding layer disposed in the bottom of the stripe groove has a greater thickness at its widthwise center portion than at its portions adjacent to the side walls of the stripe groove, so that the effective refractive index is greater at the center portion of the stripe groove where the diffraction grating is formed, which contributes to concentrating the light intensity distribution toward the center portion of the stripe groove. This overcomes the problem of excessive losses of the fundamental waveguide mode resulting from the reversion of the refractive index distribution and thus assures stable oscillation of the fundamental transverse mode.

The fabrication method of the present invention requires only two crystal growth steps. When a positive resist is used, the diffraction grating is imprinted on the multilayer structure and then the optical guiding layer is formed thereon. On the other hand, when a negative resist is used, the diffraction grating is imprinted directly on the optical guiding layer. Therefore, even if the formation of the diffraction grating is not achieved on the portions inside the stripe groove near the side walls of the current blocking layer, the optical guiding layer disposed in the bottom of the stripe groove can be made thicker at its widthwise center portion than at its portions adjacent to the side walls of the stripe groove. This serves to eliminate the variation in the stripe width during the formation of the stripe groove, and therefore, distributed feedback semiconductor lasers that achieve stable oscillation of a single longitudinal mode can be fabricated with high yield and with good reproducibility.

Thus, the invention described herein makes possible the objectives of:

(1) providing a distributed feedback semiconductor laser device requiring a low threshold current for oscillation and capable of producing stable oscillation of both single transverse and single longitudinal modes;
(2) providing a distributed feedback semiconductor laser device having a current blocking structure in which a stripe groove is easily formed in a reproducible way;
(3) providing a distributed feedback semiconductor laser device wherein the refractive index distribution in transverse directions inside a stripe groove is controlled to oscillate laser light at the fundamental transverse mode; and
(4) providing a method of fabricating such semiconductor laser devices with an improved yield and with good reproducibility of device characteristics.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
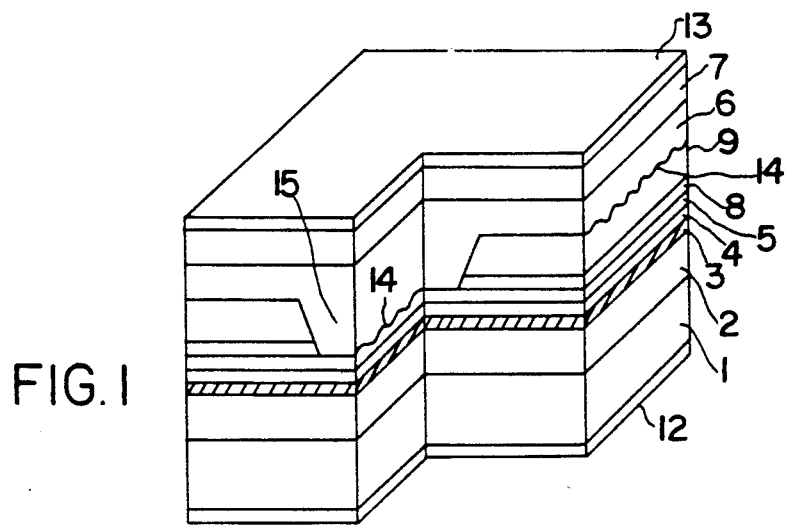
FIG. 1 shows a DFB semiconductor laser device according to the present invention.

FIG. 1 shows a DFB semiconductor laser device of an embodiment according to the invention. One of main features of the DFB semiconductor laser device is that an n-$Al_xGa_{1-x}As$ ($0.5 \leq X \leq 0.7$) etch stop layer 8 is provided between the p-$Al_{0.25}Ga_{0.75}As$ optical guiding layer 5 and the n-GaAs current blocking layer 9. The DFB semiconductor laser device was fabricated in the following steps.

First, using an epitaxial growth technique, an n-$Al_{0.5}Ga_{0.5}As$ first cladding layer 2, an $Al_{0.13}Ga_{0.87}As$ active layer 3, a p-$Al_{0.5}Ga_{0.5}As$ carrier barrier layer 4, a p-$Al_{0.25}Ga_{0.75}As$ optical guiding layer 5, an n-$Al_xGa_{1-x}As$ ($0.5 \leq X \leq 0.7$) etch stop layer 8, and an n-GaAs current blocking layer 9 were sequentially grown on an n-GaAs substrate 1.

Next, using photolithography and chemical etching techniques, the n-GaAs current blocking layer 9 and the n-$Al_xGa_{1-x}As$ etch stop layer 8 were sequentially and selectively etched to form a stripe groove (about 4 μm in width) 15 extending in parallel to the resonator direction, thereby exposing the p-$Al_{0.25}Ga_{0.75}As$ optical guiding layer 5 in the bottom the stripe groove 15. As an etchant, a mixed solution of $NH_4OH$, $H_2O_2$, and $H_2O$ was used for the n-GaAs current blocking layer 9 while an HF type etchant was used for the n-$Al_xGa_{1-x}As$ etch stop layer 8.

Next, after applying photoresist over the n-GaAs current blocking layer 9 and the exposed surface of the p-$Al_{0.25}Ga_{0.75}As$ optical guiding layer 5, a diffraction grating (pitch: about 300 nm) 14 was formed on the n-GaAs current blocking layer 9 and the exposed surface of the p-Al$_{0.25}$Ga$_{0.75}$As optical guiding layer 5 by a two-beam interference exposure method using an ultraviolet laser device as the light source and also by a chemical etching. The pitch of the diffraction grating 14 is not limited to 300 nm but may be suitably selected within the range of 200 to 400 nm.

Then, using a liquid-phase epitaxial growth technique, a p-Al$_{0.7}$Ga$_{0.3}$As second cladding layer 6 and a p-GaAs contact layer 7 were sequentially grown on the surface of the n-GaAs current blocking layer 9, thus burying the stripe groove 15. For the formation of the p-Al$_{0.7}$Ga$_{0.3}$As second cladding layer 6 and the p-GaAs contact layer 7, other techniques such as a metalorganic chemical vapor deposition (MOCVD) may be used instead of the liquid-phase epitaxial growth technique.

Finally, after forming an n-side electrode 12 on the underside of the n-GaAs substrate 1 and a p-side electrode 13 on the surface of the p-GaAs contact layer 7, the wafer was cleaved to form the endfaces of the resonator, thus completing the fabrication of the DFB semiconductor laser device shown in FIG. 1.

By appropriately adjusting the mixing ratio of NH$_4$OH and H$_2$O$_2$, a difference can be created in etch rate between the n-GaAs current blocking layer 9 and the p-Al$_{0.25}$Ga$_{0.75}$As optical guiding layer 5, therefore, it is possible to a certain extent to selectively etch only the n-GaAs current blocking layer 9 without the n-Al$_x$Ga$_{1-x}$As etch stop layer 8.

However, when the Al mole fraction (mixing ratio) x in the Al$_x$Ga$_{1-x}$As crystals is small, the difference in etch rate between the Al$_x$Ga$_{1-x}$As crystals and the GaAs crystals is usually not very large. Therefore, the etching endpoint in the n-GaAs current blocking layer 9 is not definite, which prevents good reproducibility of the width of the stripe groove 15.

In this embodiment, on the other hand, since the n-Al$_x$Ga$_{1-x}$As ($0.5 \leq X \leq 0.7$) etch stop layer 8 having a greater Al mole fraction than that of the p-Al$_{0.25}$Ga$_{0.75}$As optical guiding layer 5 is provided between the p-Al$_{0.25}$Ga$_{0.75}$As optical guiding layer 5 and the n-GaAs current blocking layer 9, the etching of the n-GaAs current blocking layer 9 can be practically stopped at the surface of the n-Al$_x$Ga$_{1-x}$As etch stop layer 8. Also, since an HF type etchant is used to etch the n-Al$_x$Ga$_{1-x}$As etch stop layer 8, only the n-Al$_x$Ga$_{1-x}$As etch stop layer 8 can be etched selectively without disrupting the surface of the p-Al$_{0.25}$Ga$_{0.75}$As optical guiding layer 5. Therefore, according to this embodiment, the stripe groove 15 can be formed with good accuracy in the n-GaAs current blocking layer 9, which serves to enhance the reproducibility of the device characteristics of the resulting DFB semiconductor laser device.

The thus fabricated DFB semiconductor laser device exhibited excellent device characteristics with an oscillation wavelength of 780 nm, a threshold current of 40 mA, and a temperature range of 70° C. over which oscillation of a single longitudinal mode was obtained. Also, the DFB semiconductor laser devices having such excellent device characteristics were fabricated with high yield and with good reproducibility of the device characteristics.

The DFB semiconductor laser device of this embodiment has a current confining structure that allows the injection of current only into the stripe groove 15 formed in the n-GaAs current blocking layer 9. Therefore, the active region including the Al$_{0.13}$Ga$_{0.87}$As active layer 3 is formed below the stripe groove 15 and the laser light generated in the active region and spreading in vertical directions perpendicular to the resonator direction is confined by the n-Al$_{0.5}$Ga$_{0.5}$As first cladding layer 2 and the p-Al$_{0.7}$Ga$_{0.3}$As second cladding layer 6. Laser light that seeped into the p-Al$_{0.25}$Ga$_{0.75}$As optical guiding layer 5 is optically fed back from the diffraction grating 14 in accordance with the proportion of the laser light, thus producing continuous laser oscillation. On the other hand, the laser light spreading in lateral directions perpendicular to the resonator direction is absorbed by the n-GaAs current blocking layer 9 and is therefore confined within the width of the stripe groove 15. As a result, the stripe groove 15 functions as a gain/loss guide optical waveguide so that oscillation of a single mode can be obtained.

Example 2

Figure 2:
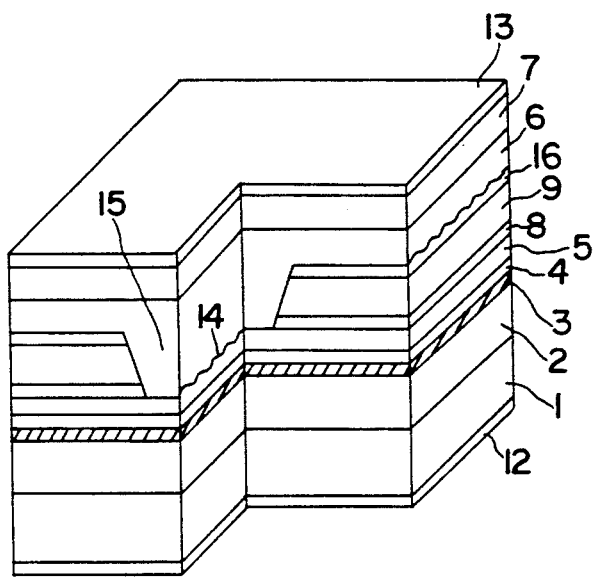
FIG. 2 shows another DFB semiconductor laser device according to the present invention.

FIG. 2 shows a semiconductor laser device of another embodiment according to the invention. This semiconductor laser device is identical to the semiconductor laser device in Example 1, except that an n-Al$_{0.25}$Ga$_{0.75}$As epitaxial support layer 16 is provided on the surface of the n-GaAs current blocking layer 9. The semiconductor device was fabricated in the following steps.

First, using an epitaxial growth technique, an n-Al$_{0.5}$Ga$_{0.5}$As first cladding layer 2, an Al$_{0.13}$Ga$_{0.87}$As active layer 3, a Al$_{0.5}$Ga$_{0.5}$As carrier layer 5, an n-Al$_x$Ga$_{1-x}$As ($0.5 \leq X \leq 0.7$) etch stop layer 8, an n-GaAs current blocking layer g, and an n-Al$_{0.25}$Ga$_{0.75}$As epitaxial support layer 16 were sequentially grown on an n-GaAs substrate 1.

Next, using photolithography and chemical etching techniques, the n-Al$_{0.25}$Ga$_{0.75}$As epitaxial support layer 16, the n-GaAs current blocking layer 9, and the n-Al$_x$Ga$_{1-x}$As etch stop layer 8 were sequentially and selectively etched to form a stripe groove 15 (about 5 μm in width) extending in parallel to the resonator direction, thereby exposing in the bottom thereof the p-Al$_{0.25}$Ga$_{0.75}$As optical guiding layer 5. As an etchant, a mixed solution of NH$_4$OH, H$_2$O$_2$, and H$_2$O was used for the n-Al$_{0.25}$Ga$_{0.75}$As epitaxial support layer 16 and the n-GaAs current blocking layer 9. In this step, by appropriately adjusting the mixing ratio of NH$_4$OH and H$_2$O$_2$, only the n-Al$_{0.25}$Ga$_{0.75}$As epitaxial support layer 16 and the n-GaAs current blocking layer 9 can be etched selectively. On the other hand, an HF type etchant was used for the n-Al$_x$Ga$_{1-x}$As etch stop layer 8.

Thereafter, the same process as in Example 1 was performed to fabricate the DFB semiconductor laser device shown in FIG. 2.

In this embodiment, the n-Al$_{0.25}$Ga$_{0.75}$As epitaxial support layer 16 having the same Al mole fraction as in the p-Al$_{0.25}$Ga$_{0.75}$As optical guiding layer 5 is formed on the surface of the n-GaAs current blocking layer 9. Therefore, when growing a p-Al$_{0.7}$Ga$_{0.3}$As second cladding layer 6 in such a manner as to bury the stripe groove 15, the epitaxial growth proceeds at the same rate both at the surface of the p-Al$_{0.25}$Ga$_{0.75}$As optical guiding layer 5 exposed in the bottom of the stripe groove 15 and at the surface of the n-Al$_{0.25}$Ga$_{0.75}$As epitaxial support layer 16. This configuration also serves to prevent the feature of the stripe groove 15 from being changed due to melt-back especially when a liquid-phase epitaxial technique is used. Therefore, according to this embodiment, the stripe groove 15 can be formed with good accuracy in the n-GaAs current blocking layer 9, further enhancing the reproducibility of the device characteristics of the resulting semiconductor laser device.

In this embodiment, both the p-$Al_{0.25}Ga_{0.75}As$ optical guiding layer 5 and the n-$Al_{0.25}Ga_{0.75}As$ epitaxial support layer 16 have the same Al mole fraction, bu if the Al mole fraction is different between these layers, there occurs a difference in the epitaxial growth rate. This serves to further enhance the surface flatness of the p-$Al_{0.7}Ga_{0.3}As$ second cladding layer 6 grown in such a manner as to bury the stripe groove 15, which contributes to further enhancing the device characteristics of the resulting DFB semiconductor laser device.

Example 3

Figure 3:
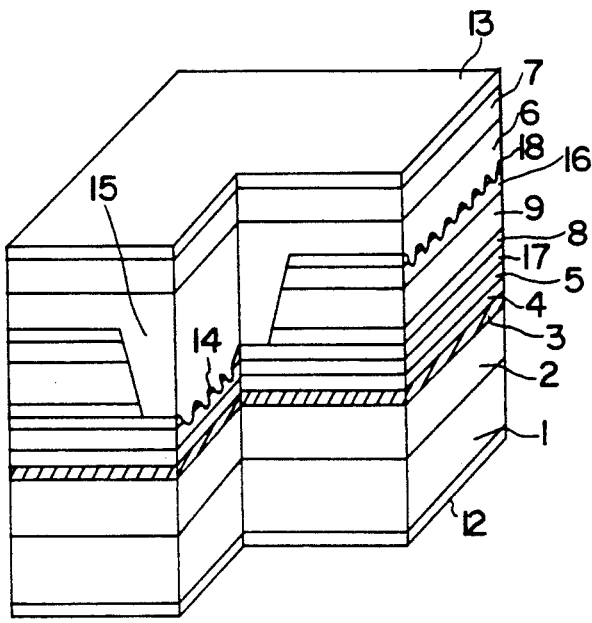
FIG. 3 shows another DFB semiconductor laser device according to the present invention.

FIG. 3 shows a DFB semiconductor laser device of another embodiment according to the invention. This DFB semiconductor laser device is identical to the DFB semiconductor device in Example 2, except for the including of two additional epitaxial support layers, i.e., a p-$Al_{0.05}Ga_{0.95}As$ grating (corrugation) epitaxial support layer 17 provided on the surface of the p-$Al_{0.25}Ga_{0.75}As$ optical guiding layer 5 and an n-$Al_{0.05}Ga_{0.95}As$ grating epitaxial support layer 18 provided on the surface of the n-$Al_{0.25}Ga_{0.75}As$ epitaxial support layer 16. The semiconductor laser device was fabricated in the following steps.

First, using an epitaxial growth technique, an n-$Al_{0.5}Ga_{0.5}As$ first cladding layer 2, an $Al_{0.13}GA_{0.87}As$ active layer 3, a p-$Al_{0.5}Ga_{0.5}As$ carrier barrier layer 4, a p-$Al_{0.25}Ga_{0.75}As$ optical guiding layer 5, a p-$Al_{0.05}Ga_{0.95}As$ grating epitaxial support layer 17 (about 5 nm in thickness), an n-$Al_xGa_{1-x}As$ ($0.5 \leq X \leq 0.7$) etch stop layer 8, an n-GaAs current blocking layer 9, an n-$Al_{0.25}Ga_{0.75}As$ epitaxial support layer 16, and an n-$Al_{0.05}Ga_{0.95}As$ grating epitaxial support layer 18 (about 5 nm in thickness) were sequentially grown on an n-GaAs substrate 1.

Next, using photolithography and chemical etching techniques, the n-$Al_{0.05}Ga_{0.95}As$ grating epitaxial support layer 18, the n-$Al_{0.25}Ga_{0.75}As$ epitaxial support layer 16, the n-GaAs current blocking layer 9, and the n-$Al_xGa_{1-x}As$ etch stop layer 8 were sequentially and selectively etched to form a stripe groove 15 (about 5 μm width) extending in parallel to the resonator direction, thereby exposing in the bottom thereof the p-$Al_{0.05}Ga_{0.95}As$ grating epitaxial support layer 17. As an etchant, a mixed solution of $NH_4OH$, $H_2O_2$, and $H_2O$ was used for the n-$Al_{0.05}Ga_{0.95}As$ grating epitaxial support layer 18, the n-$Al_{0.25}Ga_{0.75}As$ epitaxial support layer 16, and the n-GaAs current blocking layer 9. In this step, by appropriately adjusting the mixing ratio of $NH_4OH$ and $H_2O_2$, only the n-$Al_{0.05}Ga_{0.95}As$ grating epitaxial support layer 18, the n-$Al_{0.25}Ga_{0.75}As$ epitaxial support layer 16, and the n-GaAs current blocking layer 9 can be etched selectively in a single etching step. On the other hand, an HF type etchant was used for the n-$Al_xGa_{1-x}As$ etch stop layer 8.

Thereafter, the same process as in Example 1 was performed to fabricate the DFB semiconductor laser device shown in FIG. 3.

In this embodiment, the p-$Al_{0.05}Ga_{0.95}As$ grating epitaxial support layer 17 and the n-$Al_{0.05}Ga_{0.95}As$ grating epitaxial support layer 18 are formed on the p-$Al_{0.25}Ga_{0.75}As$ optical guiding layer 5 and the n-$Al_{0.25}Ga_{0.75}As$ epitaxial support layer 16, respectively. Therefore, when the diffraction grating 14 is formed by the two-beam interference exposure method and a chemical etching technique, these epitaxial layers remain on the ridges of the diffraction grating 14. This facilitates the epitaxial growth of a p-$Al_{0.7}Ga_{0.3}As$ second cladding layer 6 to bury the stripe groove 15. This is because the smaller the Al mole fraction in the underlying epitaxial support layer is, the easier the epitaxial growth on it becomes. This tendency is particularly remarkable in the case of liquid-phase epitaxy. Therefore, according to this embodiment, the diffraction grating 14 formed on the surfaces of the p-$Al_{0.25}Ga_{0.75}As$ optical guiding layer 5 and n-$Al_{0.25}Ga_{0.75}As$ epitaxial support layer 16 can be buried easily in the second growth step, assuring high-yield production of semiconductor laser devices having good device characteristics without causing imperfections of growth or crystal defects.

In this embodiment, the Al mole fraction in the AlGaAs mixed crystals forming the grating epitaxial support layers 17 and 18 is set at 0.5, but the Al mole fraction is not restrictive, and GaAs mixed crystals with the Al mole fraction of 0 may be used, for example. When the GaAs mixed crystals are used, the diffraction grating 14 can be buried by the p-$Al_{0.7}Ga_{0.3}As$ second cladding layer 6 in the second growth step using liquid-phase epitaxy, after removing these GaAs epitaxial support layers by melt-back. In this case also, the same effects as the above embodiment can be obtained, and DFB semiconductor laser devices having good device characteristics can be produced with high yield.

Although the above Examples 1-3 have dealt with AlGaAs type DFB semiconductor laser devices, it will be appreciated that the same effects stated herein can be obtained, for example, also for GaInAsP/InP type DFB semiconductor laser devices.

Thus, according to the invention, since the diffraction grating is formed on the surface of the optical guiding layer formed above the active layer, a DFB semiconductor laser device requiring a low threshold current for oscillation and capable of producing stable oscillation of both single transverse and single longitudinal modes can be obtained. Furthermore, since the fabrication of this semiconductor laser device requires only two growth steps, a fabrication method is provided which assures high yield and good reproducibility of device characteristics.

Example 4

Figure 4:
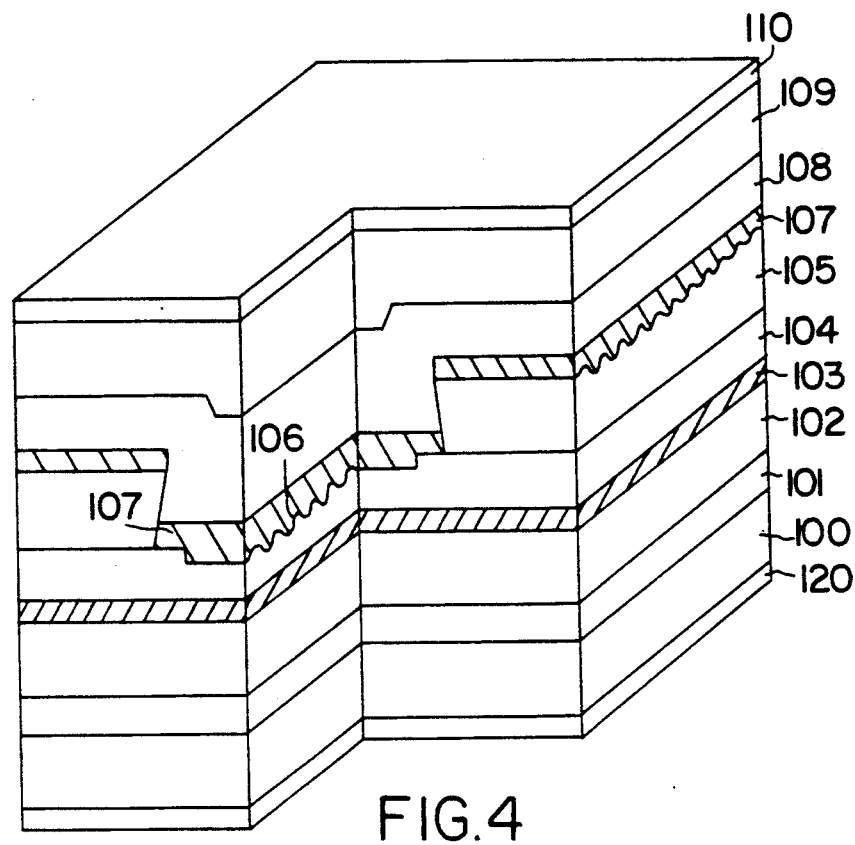
FIG. 4 shows another DFB semiconductor laser device according to the present invention.

FIG. 4 schematically shows a DFB semiconductor laser device of another embodiment according to the invention. The DFB semiconductor laser device was fabricated in the following steps.

Figure 5A:
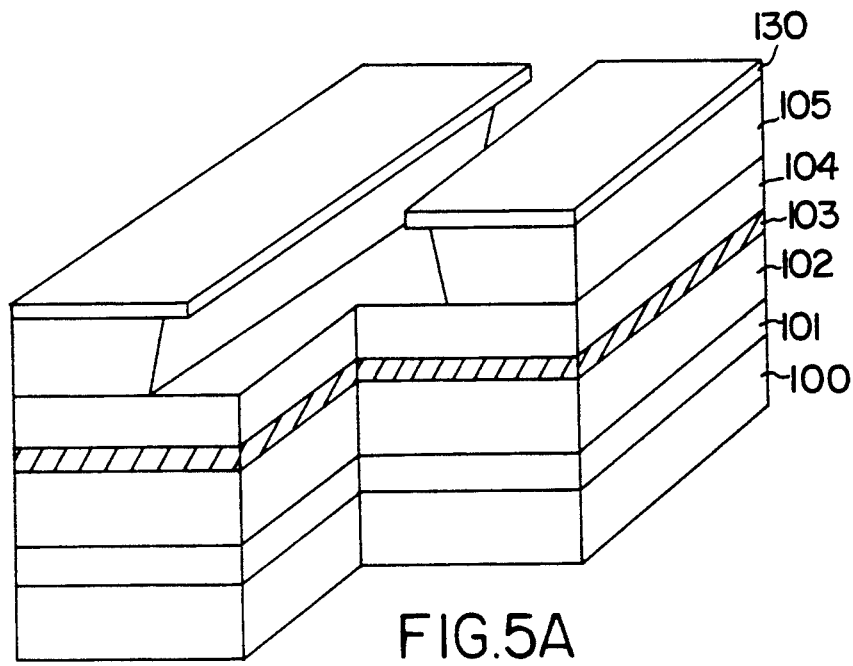
FIGS. 5A through 5C show a fabrication process sequence of the DFB semiconductor laser device shown in FIG. 4.

First, as shown in FIG. 5A, a Se-doped n-GaAs buffer layer 101 (thickness: 0.5 μm), a Se-doped n-$Al_{0.5}Ga_{0.5}As$ first cladding layer 102 (thickness: 1.0 μm), a non-doped $Al_{0.13}Ga_{0.87}As$ active layer 103 (thickness: 0.08 μm), a Zn-doped p-$Al_{0.5}Ga_{0.5}As$ carrier barrier layer 104 (thickness: 0.15 μm), and a Se-doped n-GaAs current blocking layer 105 (thickness: 0.6 μm) were sequentially grown on the (100) plane of a Si-doped n-GaAs substrate 100 in a first crystal growth step using an MOCVD method.

Then, as shown in FIG. 5A, a resist mask 130 was formed on the current blocking layer 105 by a conventional photolithography technique, after which the current blocking layer 105 was etched down to the carrier barrier layer 104 by a chemical etching technique to form a stripe groove (width: 4 μm) along the <011> direction. As an etchant, an ammonia/hydrogen peroxide solution was used. By selecting the mixing ratio given above, the etch process can be stopped when the etching has reached the carrier barrier layer 104. As a result, the surface of the carrier barrier layer 104 is exposed in the bottom of the stripe groove.

Figure 5B:
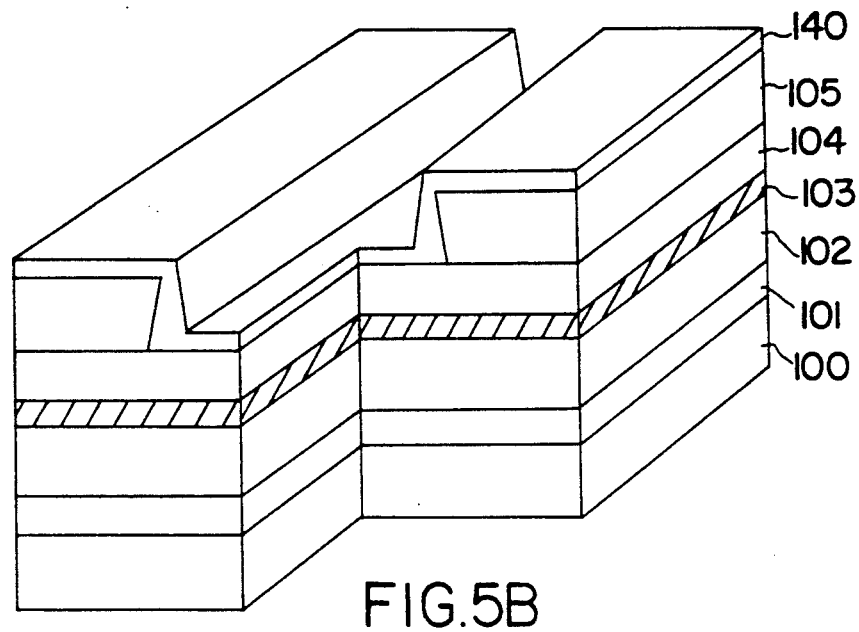

Next, after removing the etching resist mask 130 by cleaning with an organic solvent, a positive resist 140 was applied on the upper surface of the current blocking layer 105 and the inside surface of the stripe groove, as shown in FIG. 5B, by spin coating. At this time, the positive resist 140 was deposited to a greater thickness at the portions inside the stripe groove near the side walls of the current blocking layer 105.

Figure 5C:
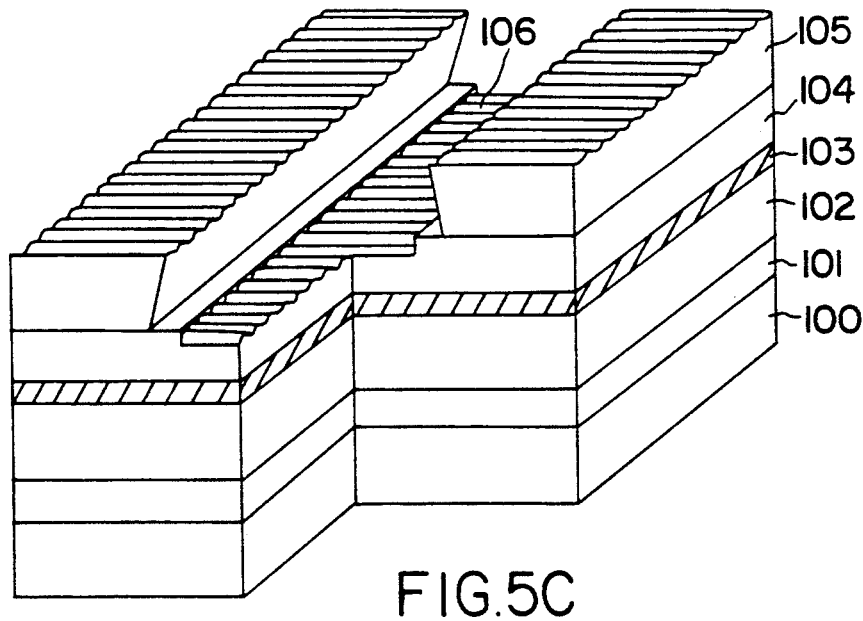

Further, over the upper surfaces of the current blocking layer 105 and the carrier barrier layer 104 inside the stripe groove, a diffraction grating 106 was imprinted along the $<0\overline{1}1>$ direction of the substrate 100, as shown in FIG. 5C, by using the two-beam interference exposure method and a chemical etching technique. The diffraction grating 106 was formed at a pitch of about 330 nm and to a depth of about 100 nm. Since the positive resist 140 was deposited thicker at the portions adjacent to the side walls of the current blocking layer 105 and therefore those portions were difficult to expose because of the interference by the side walls, the diffraction grating 106 was not formed on the portions adjacent to the side walls but formed only on the widthwise center portion (width: about 2 $\mu$m) of the stripe groove. This is because of the following reason. Generally, since unexposed portions of the positive resist remain after development, the positive resist remains at the portions inside the stripe groove near the side walls of the current blocking layer 105. Therefore, when the diffraction grating 106 is formed by chemical etching, the portions of the carrier barrier layer 104 near the side walls of the current blocking layer 105 are protected against etching. As a result, on the carrier barrier layer 104 exposed in the bottom of the stripe groove, raised portions are formed adjacent to the side walls of the current blocking layer 105 while the diffraction grating 106 is formed on the center portion of the carrier barrier layer 104.

The above step was followed by a second crystal growth step using an MOCVD method, in which, as shown in FIG. 4, a Zn-doped p-$Al_{0.25}Ga_{0.75}As$ optical guiding layer 107 (thickness: 0.1 $\mu$m) was grown on the upper surfaces of the carrier barrier 104 and current blocking layer 105, and then, a Zn-doped p-$Al_{0.75}Ga_{0.25}As$ second cladding layer 108 (thickness: 1.0 $\mu$m) and a Zn-doped p-GaAs contact layer 109 (thickness: 1.0 $\mu$m) were sequentially grown on the optical guiding layer 107 in such a manner as to bury the stripe groove. At this time, since (111) planes were exposed on the side walls of the current blocking layer 105 inside the stripe groove, the crystal growth rate on those planes was extremely slow and as a result, the optical guiding layer 107 was grown only where (100) planes were exposed, i.e., on the upper surfaces of the current blocking layer 105 and the carrier barrier layer 104 inside the stripe groove.

Finally, after forming an n-side electrode 120 on the underside of the substrate 100 and a p-side electrode 110 on the upper side of the contact layer 109, the wafer was cleaved into chips, thus completing the fabrication of the semiconductor laser device shown in FIG. 4.

Example 5

Figure 6:
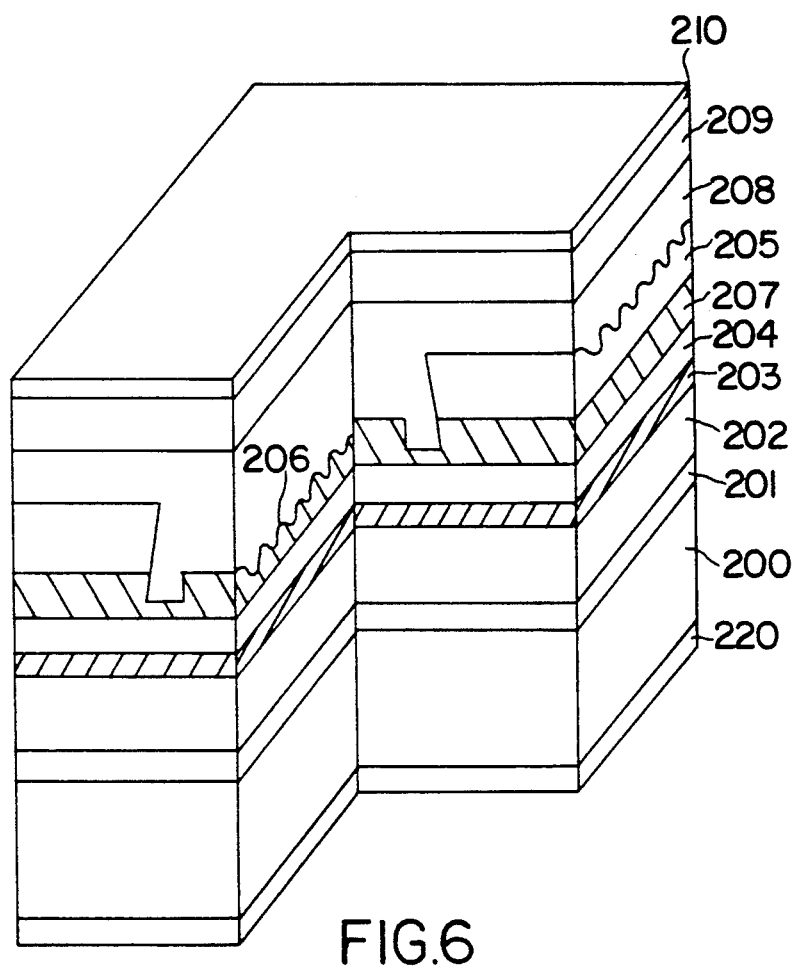
FIG. 6 shows another DFB semiconductor laser device according to the present invention.

FIG. 6 schematically shows the structure of a DFB semiconductor laser device of another embodiment according to the invention. The DFB semiconductor laser device was fabricated in the following steps.

Figure 7A:
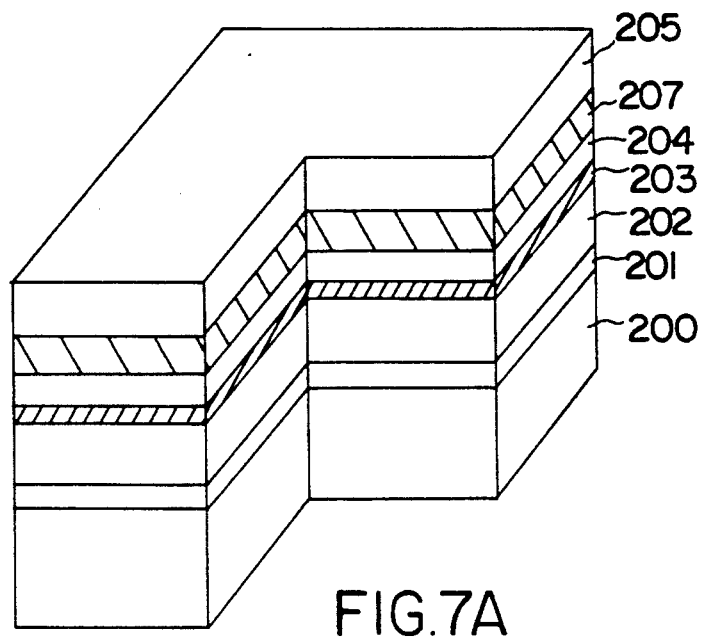
FIGS. 7A through 7D show a fabrication process sequence of the DFB semiconductor laser device shown in FIG. 6.

First, as shown in FIG. 7A, a Se-doped n-GaAs buffer layer 201 (thickness: 0.5 $\mu$m), a Se-doped n-$Al_{0.5}Ga_{0.5}As$ first cladding layer 202 (thickness: 1.0 $\mu$m), a non-doped $Al_{0.13}Ga_{0.87}As$ active layer 203 (thickness: 0.08 $\mu$m), a Zn-doped p-$Al_{0.5}Ga_{0.5}As$ carrier barrier layer 204, a Zn-doped p-$Al_{0.25}Ga_{0.75}As$ optical guiding layer 207, and a Se-doped n-GaAs current blocking layer 205 were sequentially grown on the (100) plane of a Si-doped n-GaAs substrate 200 in a first crystal growth step using an MOCVD method.

Figure 7B:
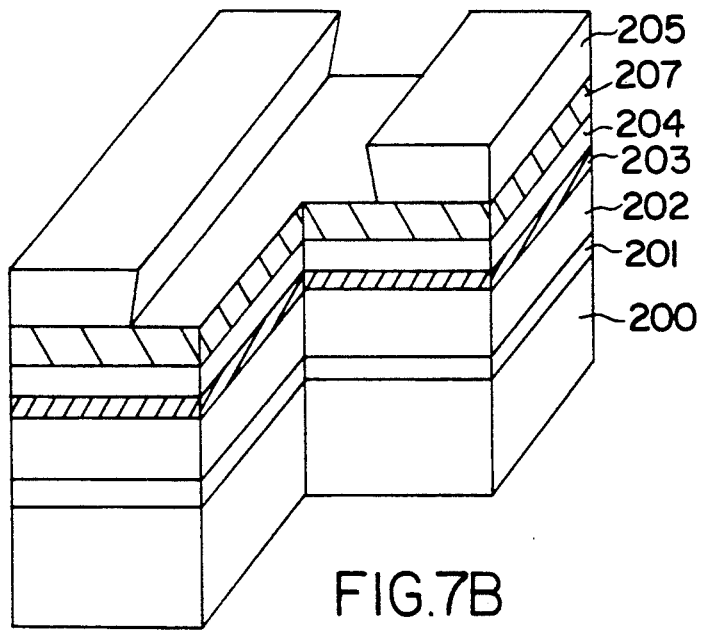

Then, as shown in FIG. 7B, using a conventional photolithography and chemical etching techniques, the current blocking layer 205 was etched down to the optical guiding layer 207 to form a stripe groove (width: 4 $\mu$m) along the $<011>$ direction. As an etchant, an ammonia/hydrogen peroxide solution was used. By selecting the mixing ratio given above, the etch process can be stopped when the etching has reached the optical guiding layer 207. As a result, the surface of the optical guiding layer 207 is exposed in the bottom of the stripe groove.

Figure 7C:
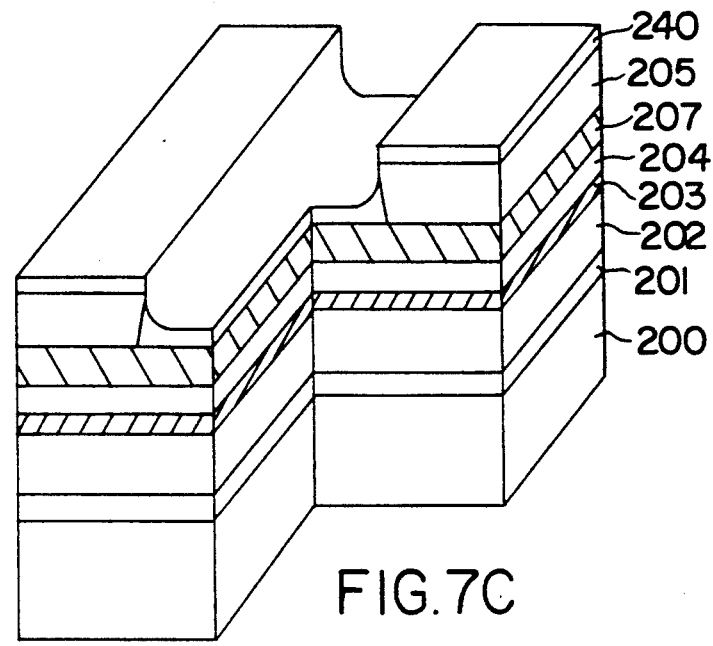

Next, as shown in FIG. 7C, a negative resist 240 was applied on the upper surface of the current blocking layer 205 and the inside surface of the strip groove. At this time, the negative resist 240 was deposited to a greater thickness at the portions inside the stripe groove near the side walls of the current blocking layer 205.

Figure 7D:
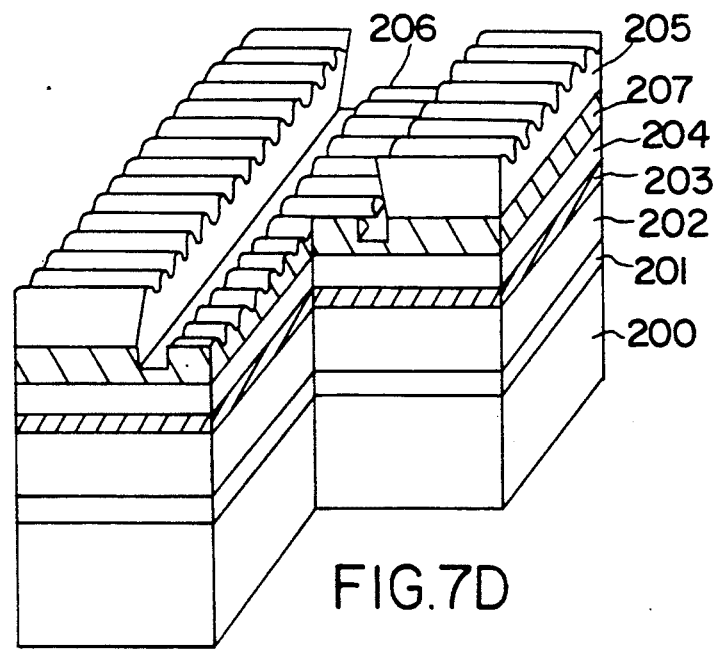

Further, over the upper surfaces of the current blocking layer 205 and the optical guiding layer 207 inside the stripe groove, a diffraction grating 206 was imprinted along the $<0\overline{1}1>$ direction of the substrate 200, as shown in FIG. 7D, by using the two-beam interference exposure method and a chemical etching technique. The diffraction grating 206 was formed at a pitch of about 300 nm and to a depth of about 100 nm. Since the negative resist 240 was deposited thicker at the portions adjacent to the side walls of the current blocking layer 205 and therefore those portions were difficult to expose because of the interference by the side walls, the diffraction grating 206 was not formed on the portions adjacent to the side walls but formed only on the widthwise center portion (width: about 2 $\mu$m) of the stripe groove. This is because of the following reason. Generally, since unexposed portions of the negative resist are removed after development, the surface of the optical guiding layer 207 becomes exposed at the portions inside the stripe groove near the side walls of the current blocking layer 205. Therefore, when the diffraction grating 206 is formed by chemical etching, the portions of the optical guiding layer 207 near the side walls of the current blocking layer 205 are etched back and the thickness is reduced at these portions. As a result, on the optical guiding layer 207 exposed in the bottom of the stripe groove, recessed portions are formed adjacent to the side walls of the current blocking layer 205 while the diffraction grating 206 is formed on the center portion of the optical guiding layer 207.

The above step was followed by a second crystal growth step using an MOCVD method, in which, as shown in FIG. 6, a Zn-doped p-$Al_{0.75}Ga_{0.25}As$ second cladding layer 208 (thickness: 1.0 $\mu$m) and a Zn-doped p-GaAs contact layer 209 (thickness: 1.0 $\mu$m) were sequentially grown on the upper surfaces of the optical guiding layer 207 and current blocking layer 205 in such a manner as to bury the stripe groove.

Finally, after forming an n-side electrode 220 on the underside of the substrate 200 and a p-side electrode 210 on the upper side of the contact layer 209, the wafer was cleaved into chips, thus completing the fabrication of the semiconductor laser device shown in FIG. 6.

Figure 8A:
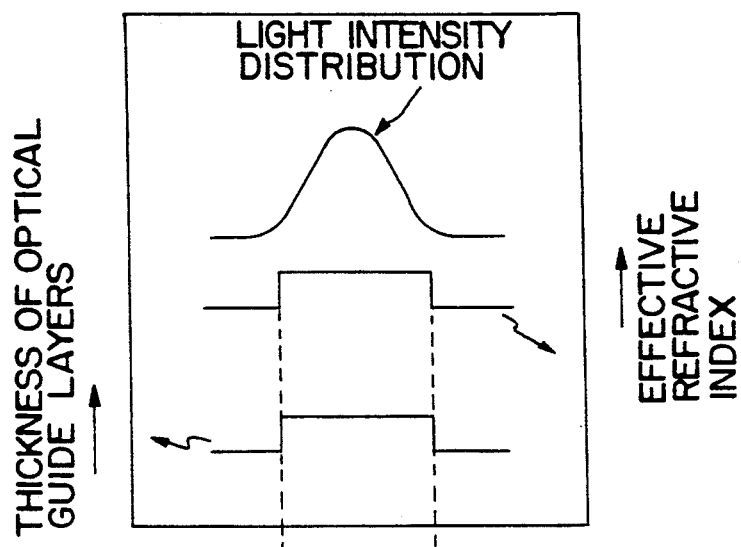
FIG. 8($a$)–8($b$) shows the refractive index distribution in transverse directions inside stripe grooves and the thickness of optical guiding layers in the DFB semiconductor laser devices shown in FIGS. 4 and 6.
Figure 8B:
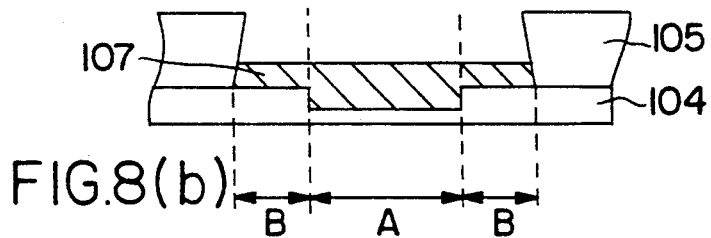
Figure 8C:
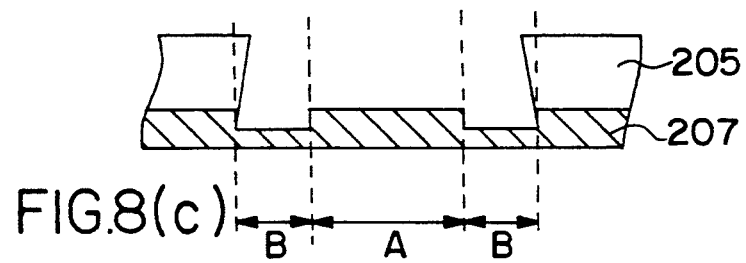
Figure 9A:
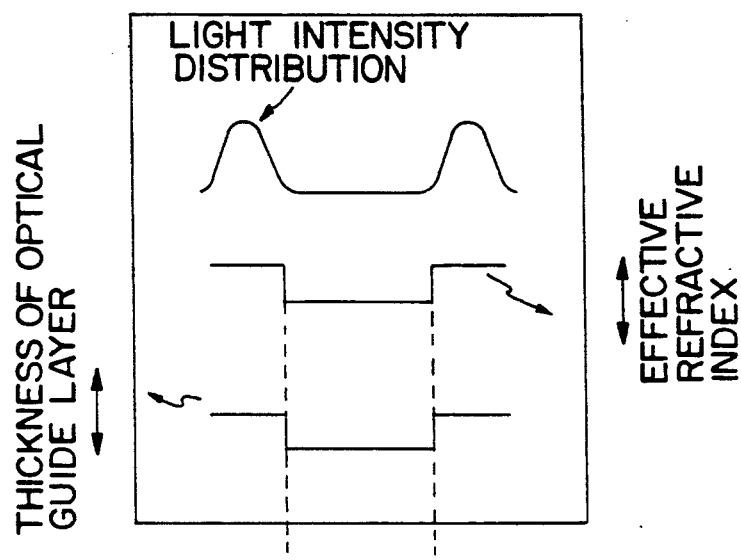
FIG. 9($a$)–9($b$) shows the refractive index distribution in transverse directions inside a stripe groove and the thickness of an optical guiding layer in a prior art DFB semiconductor laser device.
Figure 9B:
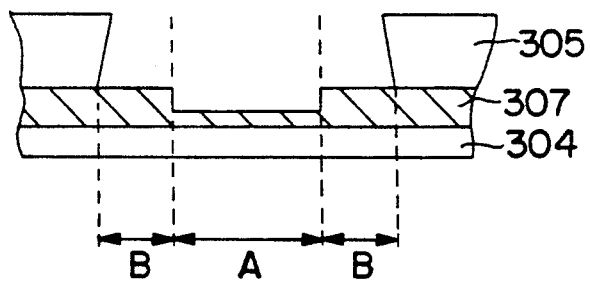
Figure 10:
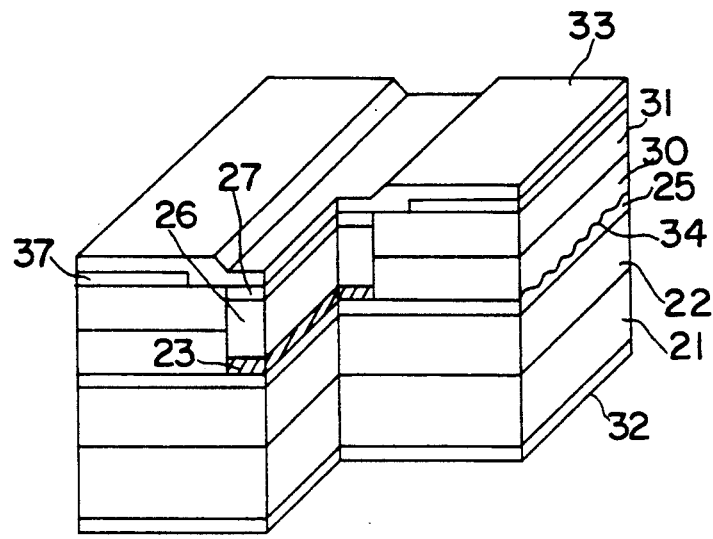
FIGS. 10 through 12 show prior art DFB semiconductor laser devices.
Figure 11:
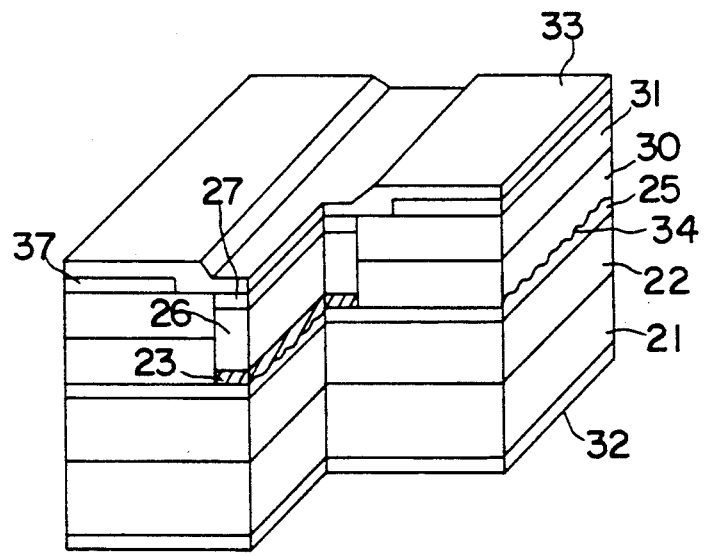
Figure 12:
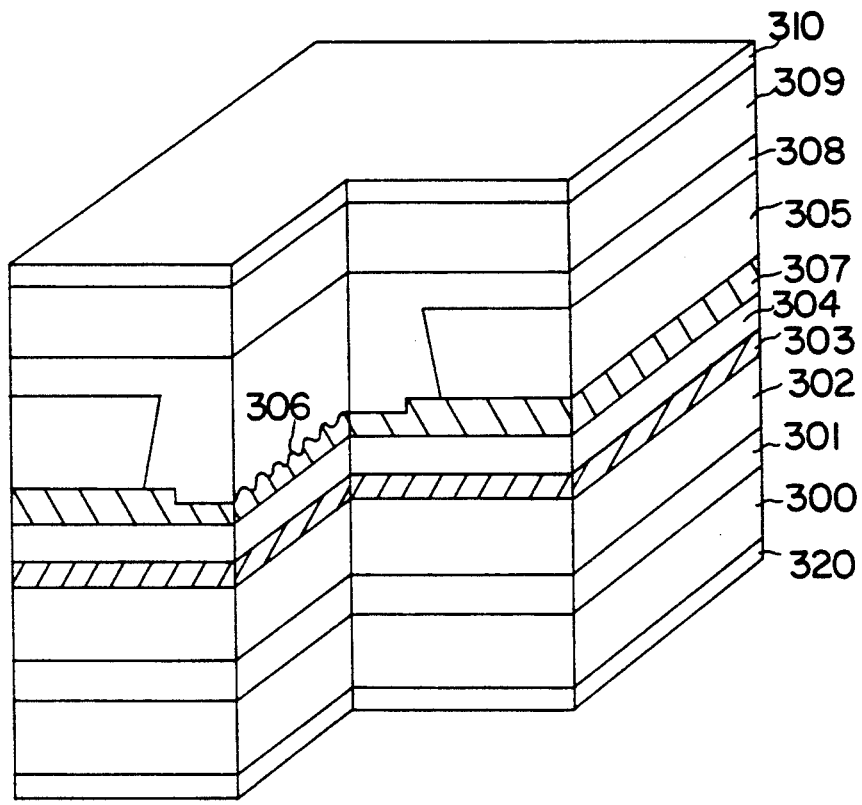

As shown in (b) and (c) of FIG. 8, in the DFB semiconductor laser device of either Example 4 or 5, the thickness of the optical guiding layers 107 and 207 is greater at the center portion of the stripe groove (region A in FIG. 8) where the diffraction grating is formed than at the portions adjacent to the side walls of the current blocking layer (region B in FIG. 8) where the diffraction grating is not formed. As a result, as shown in (a) of FIG. 8, the effective refractive index in transverse directions is greater in region A than in region B, so that the light intensity distribution is concentrated on region A. Even if the formation of the diffraction grating is not achieved on the portions inside the stripe groove near the side walls of the current blocking layer, since the laser light is confined in the center of the stripe groove, the waveguide losses of the fundamental transverse mode can be reduced significantly. The refractive index distribution in transverse directions inside the stripe groove can thus be controlled by the thickness of the optical guiding layer, enabling oscillation of the fundamental transverse mode.

Also, according to the refractive index waveguide structure of the above embodiments, since the refractive index distribution within the stripe groove is concentrated on a region narrower than the width of the stripe groove, the effective waveguide width can be made smaller than the width of the stripe groove. As a result, the far-field pattern in the horizontal direction is enlarged, allowing improvement of the ellipticity.

Furthermore, since the refractive index distribution within the stripe groove does not entail a collateral loss distribution, the waveguide provides a perfect real refractive index, offering such advantages as the drastic reduction of mode losses and the elimination of astigmatic differences resulting from wavefront distortion.

Although the above embodiments have dealt with AlGaAs/GaAs type DFB semiconductor laser devices, it will be appreciated that the invention can also be applied to InGaAlP/GaAs or InGaAsP/InP type semiconductor laser devices.

Thus, according to the invention, a DFB semiconductor laser device having an efficient refractive index waveguide structure with reduced waveguide losses and capable of achieving stable oscillation of a fundamental transverse mode can be obtained. The semiconductor laser device of the invention has such advantages as a low threshold current, an improved ellipticity, the elimination of astigmatic differences, etc. Also, according to the fabrication method of the invention, DFB semiconductor laser devices having good oscillation characteristics can be fabricated with only two crystal growth steps and with high yield and good reproducibility.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A distributed feedback semiconductor laser device comprising:
   a semiconductor substrate;
   a multilayer structure formed on said semiconductor substrate, said multilayer structure including an active layer for laser oscillation;
   an optical guiding layer formed on said multilayer structure;
   a current blocking structure for confining electric currents within a selected region of said active layer, said current blocking structure being formed over said optical guiding layer and having a stripe groove along the cavity length direction, said stripe groove defining said selected region and exposing said optical guiding layer, and said current blocking structure including an etch stop layer in the lower portion of said current blocking structure; and
   a diffraction grating formed in a region of said optical guiding layer, said region being located at the bottom of said stripe groove.

2. A distributed feedback semiconductor laser device according to claim 1, wherein said current blocking structure includes an epitaxial growth support layer in the upper portion of said current blocking structure.

3. A distributed feedback semiconductor laser device according to claim 1, wherein said current blocking structure includes grating support and epitaxial layers in the upper portion of said current blocking structure, and said multilaye structure includes an epitaxial growth support layer in the upper portion of said multilayer structure.

4. A distributed feedback semiconductor laser device according to claim 1, wherein said multilayer structure includes a first cladding layer formed under said active layer, and a carrier barrier layer formed on said active layer.

5. A distributed feedback semiconductor laser device comprising:
   a semiconductor substrate;
   a multilayer structure formed on said semiconductor substrate, said multilayer structure including an active layer for laser oscillation;
   an optical guiding layer formed on said multilayer structure;
   a current blocking structure for confining electric currents within a selected region of said active layer, said current blocking structure being formed over said optical guiding layer and having a stripe groove along the cavity length direction, said stripe groove defining said selected region; and
   a diffraction grating formed in a region of said optical guiding layer, said region being located at the bottom of said stripe groove and at the widthwise center portion of said stripe groove, said region of said optical guiding layer having a greater thickness than that of regions adjacent to the side walls of said stripe groove.

6. A distributed feedback semiconductor laser device comprising:
   a semiconductor substrate;

a multilayer structure formed on said semiconductor substrate, said multilayer structure including an active layer for laser oscillation;

a current blocking structure for confining electric currents within a selected region of said active layer, said current blocking structure being formed on said multilayer structure and having a stripe groove along the cavity length direction, said stripe groove defining said selected region;

a diffraction grating formed in a region of said multilayer structure, said region being located at the bottom of said stripe groove; and an optical guiding layer formed on said diffraction grating, said optical guiding layer having a greater thickness at the widthwise center portion of said optical guiding layer than at portions adjacent to the side walls of said stripe shaped groove.

7. A method of fabricating a distributed feedback semiconductor laser device comprising the steps of:

forming a multilayer structure on a semiconductor substrate, said multilayer structure including an active layer for laser oscillation;

forming an optical guiding layer on said multilayer structure;

forming at least one etch stop layer on said optical guiding layer;

forming a current blocking layer on said etch stop layer;

forming a stripe groove along the cavity length direction in said current blocking layer by selectively etching said current blocking layer, to expose a region of said etch stop layer through said stripe groove;

selectively etching said exposed region of said etch stop layer; and forming a diffraction grating in said optical guiding layer.

8. A method of fabricating a distributed feedback semiconductor laser device comprising the steps of:

forming a multilayer structure on a semiconductor substrate, said multilayer structure including an active layer for laser oscillation;

forming a current blocking structure on said multilayer structure;

forming a stripe groove along the cavity length direction in said current blocking structure, to expose a surface region of said multilayer structure through said stripe groove;

forming a diffraction grating in said surface region of said multilayer structure by a photolithography technique using a positive resist; and forming an optical guiding layer on said surface of said multilayer structure to cover said diffraction grating.

9. A method of fabricating a distributed feedback semiconductor laser device comprising the steps of:

forming a multilayer structure on a semiconductor substrate, said multilayer structure including an active layer for a laser oscillation;

forming an optical guiding layer on said multilayer structure;

forming a current blocking structure on said multilayer structure;

forming a stripe groove along the cavity length direction in said current blocking layer, to expose a surface region of said optical guiding layer through said stripe groove; and forming a diffraction grating in said surface region of said optical guiding layer by a photolithography technique using a negative resist.

10. An AlGaAs type distributed feedback semiconductor laser device comprising:

a semiconductor substrate;

a multilayer structure formed on said semiconductor substrate, said multilayer structure including an active layer for laser oscillation and a carrier barrier layer for reducing carrier-overflows from said active layer;

an optical guiding layer formed on said multilayer structure;

a current blocking structure for confining electric currents within a selected region of said active layer, said current blocking structure being formed over said optical guiding layer and having a stripe groove along the cavity length direction, said stripe groove defining said selected region and exposing said optical guiding layer, and said current blocking structure including an etch stop layer in the lower portion of said current blocking structure; and a diffraction grating formed in a region of said optical guiding layer, said region being located at the bottom of said stripe groove.

11. An AlGaAs type distributed feedback semiconductor laser device according to claim 10, wherein said current blocking structure includes an expitaxial growth support layer in the upper portion of said current blocking structure.

12. An AlGaAs type distributed feedback semiconductor laser device according to claim 10, wherein said current blocking structure includes grating support and epitaxial layers in the upper portion of said current blocking structure, and said multilayer structure includes an epitaxial growth support layer in the upper portion of said multilayer structure;

13. An AlGaAs type distributed feedback semiconductor laser device according to claim 10, wherein said multilayer structure includes a first cladding layer formed under said active layer, and said carrier barrier layer formed on said active layer.

* * * * *